(12) United States Patent
Cok et al.

(10) Patent No.: US 8,115,383 B2
(45) Date of Patent: Feb. 14, 2012

(54) ELECTROLUMINESCENT AREA ILLUMINATION WITH INTEGRATED MECHANICAL SWITCH

(75) Inventors: Ronald S. Cok, Rochester, NY (US); Michael E. Miller, Honeoye Falls, NY (US)

(73) Assignee: Global OLED Technology LLC, Herndon, VA (US)

( * ) Notice: Subject to any disclaimer, the term of this patent is extended or adjusted under 35 U.S.C. 154(b) by 306 days.

(21) Appl. No.: 12/608,043

(22) Filed: Oct. 29, 2009

(65) Prior Publication Data

US 2011/0101870 A1    May 5, 2011

(51) Int. Cl.
*H01J 1/62* (2006.01)
*G09G 3/10* (2006.01)

(52) U.S. Cl. ...... 313/506; 313/498; 313/512; 315/169.3

(58) Field of Classification Search .................. 313/498, 313/503–506, 509, 511, 512; 315/169.3
See application file for complete search history.

(56) References Cited

U.S. PATENT DOCUMENTS

| | | | |
|---|---|---|---|
| 5,748,159 A | 5/1998 | Nishio et al. | |
| 6,037,719 A | 3/2000 | Yap et al. | |
| 6,680,578 B2 | 1/2004 | Antoniadis | |
| 6,791,824 B2 | 9/2004 | Tanimura et al. | |
| 6,819,036 B2 | 11/2004 | Cok | |
| 6,879,098 B2 * | 4/2005 | Buchwalter et al. | 313/500 |
| 7,265,332 B2 | 9/2007 | Baxter | |
| 7,386,421 B2 | 6/2008 | Miki | |
| 7,521,667 B2 | 4/2009 | Rains, Jr. et al. | |
| 7,816,856 B2 * | 10/2010 | Cok et al. | 313/503 |
| 7,994,714 B2 * | 8/2011 | Cok et al. | 313/506 |
| 8,013,525 B2 * | 9/2011 | Cok et al. | 313/511 |

FOREIGN PATENT DOCUMENTS

| | | |
|---|---|---|
| GB | 2 371 910 A | 8/2002 |
| WO | 02/07482 A2 | 1/2002 |
| WO | 2009/060373 | 5/2009 |

OTHER PUBLICATIONS

Qiu et al, A High-Current Electrothermal Bistable MEMS Relay, Micro Electro Mechanical Systems, 2003, p. 64-67.
Yoon et al, A novel use of MEMS switches in driving AMOLED, SID 2008, 3.4, p. 13.

* cited by examiner

*Primary Examiner* — Tung X Le
(74) *Attorney, Agent, or Firm* — Morgan, Lewis & Bockius LLP

(57) ABSTRACT

An electroluminescent lam including a lamp substrate; a first electrode formed over the lamp substrate device side, one or more layers having light-emitting material formed over the first electrode, and a second electrode formed over the one or more layers, a chiplet having a chiplet substrate separate and independent from the lamp substrate and adhered to the lamp substrate device side, one or more connection pads, a mechanical switch, and a control circuit for controlling the mechanical switch, the mechanical switch electrically connected to one or more connection pads and at least one connection pad electrically connected to the first or second electrode with one or more electrical connection(s); and an insulating and planarization layer formed over at least a portion of the chiplet and the electrical connections so that the chiplet is an embedded chiplet.

21 Claims, 8 Drawing Sheets

ELECTROLUMINESCENT AREA ILLUMINATION WITH INTEGRATED MECHANICAL SWITCH

FIELD OF THE INVENTION

The present invention relates to control devices for electroluminescent (EL) lamps.

BACKGROUND OF THE INVENTION

Solid-state electroluminescent (EL) lighting devices made of area-emissive light-emitting diodes, both organic and inorganic are increasingly useful for applications requiring robustness and long-life. Such solid-state lighting devices are of great interest because they provide a light-emitting area rather than a point source of light (as is found in inorganic light-emitting diodes formed in crystalline semiconductors). This attribute of EL lighting devices reduces the maximum heat of the device, facilitates efficient extraction of light from the diodes in a lighting fixture or luminaire, and provides large-area diffuse illumination sources, which are preferred in many environments to reduce eye strain and provide a comfortable viewing environment. To obtain these advantages, it is desirable that the luminaire have a large area, typically greater than 200 $cm^2$ and often well in excess of 3000 $cm^2$.

Organic EL devices, such as organic light emitting diodes (OLEDs), can be manufactured by depositing materials on a substrate and encapsulating them with a cover or layer. This process enables the creation of single, monolithic lighting elements on a single substrate. Such substrates can be removably inserted into a socket and controlled, for example, by a light switch mounted on a wall or on a lamp fixture. Alternatively, a control switch can be mounted directly in a socket, for example as taught in U.S. Pat. No. 6,819,036.

During the deposition process, very thin layers of light-emitting materials, often on the order of 10 s or 100 s of nm in thickness, are deposited between pairs of electrodes. Because of the very small distance between these electrodes, shorts can occur between the electrodes. These shorts can be immediately visible but can also form over time and can prevent a lamp from functioning entirely, reduce the luminance of the lamp, or detract from its appearance.

Intelligent and sophisticated control systems for lighting are known in the industry. For example, U.S. Pat. No. 7,521,667 includes references to inorganic, point-source LED lamps having a sensor. U.S. Pat. No. 7,265,332 describes a light monitor and lighting control system and discusses inexpensive, miniaturized light monitoring systems and control systems useful in large-building lighting networks. WO2009/060373 discusses optical communication in which an OLED can serve as an emitter and a sensor. U.S. Pat. No. 7,386,421 discloses a lighting control system for optimizing area illumination at a desired position. U.S. Pat. No. 6,791,824 describes an outdoor lighting control system for an outdoor lighting system network for automatically sensing, conveying, and recording data relevant to the operation of the lighting system network so that both control and maintenance can be performed more efficiently. At each of plural lamp locations in the network, there is a controller module that receives electric power input and that supplies electric power to the remaining lamp locations. Each controller module has a first relay to deliver current to one or more outdoor illumination lamps at the controller module's location and a second relay for switching electric power on to a succeeding lamp location. A first current sensor monitors current to the lamps at each lamp location, and a second current sensor monitors current to the remaining locations.

Such control methods for flat-panel area-emissive lighting are useful, but the switch mechanisms conventionally employed in lighting can be large and relatively expensive. Furthermore, typical lamps employing OLED materials employ a plurality of emissive elements on a single substrate, to improve the robustness of the lamp. It can be advantageous to separately control different light-emitting elements, or groups of electrically-connected light-emitting elements, that are all formed on a single substrate as taught in U.S. Pat. No. 6,680,578. Techniques to do so can require an excessive number of external connections to the substrate, wiring to the lamp, and switches. Moreover, the use of sensors and sophisticated control mechanisms to provide intelligent lighting can create complex and expensive wiring circuits and sensors in buildings that employ intelligent lighting control systems.

In view of the foregoing, it is therefore an object of the present invention to provide an improved control device for flat-panel, area-emissive lighting that provides a high level of integration at reduced manufacturing cost, intelligent control, and reduced infrastructure requirements.

SUMMARY OF THE INVENTION

In accordance with one aspect of the present invention there is provided an electroluminescent lamp, comprising:

(a) a lamp substrate having a device side;

(b) a first electrode formed over the lamp substrate device side, one or more layers having light-emitting material formed over the first electrode, and a second electrode formed over the one or more layers, the first and second electrodes providing current to cause the light-emitting material to emit light in a light-emitting area;

(c) a chiplet having a chiplet substrate separate and independent from the lamp substrate and adhered to the lamp substrate device side, one or more connection pads, a mechanical switch, and a control circuit for controlling the mechanical switch, the mechanical switch electrically connected to one or more connection pads and at least one connection pad electrically connected to the first or second electrode with one or more electrical connection(s); and (d) an insulating and planarization layer formed over at least a portion of the chiplet and the electrical connections so that the chiplet is an embedded chiplet.

The present invention provides an improved control device for flat-panel, area-emissive lighting that includes a high level of integration at reduced manufacturing cost, intelligent control, and reduced infrastructure requirements.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

In the detailed description of the preferred embodiments of the invention presented below, reference is made to the accompanying drawings in which.

It will be understood that the figures are not to scale since the individual layers are too thin and the thickness differences of various layers too great to permit depiction to scale.

DETAILED DESCRIPTION OF THE INVENTION

Figure 1:
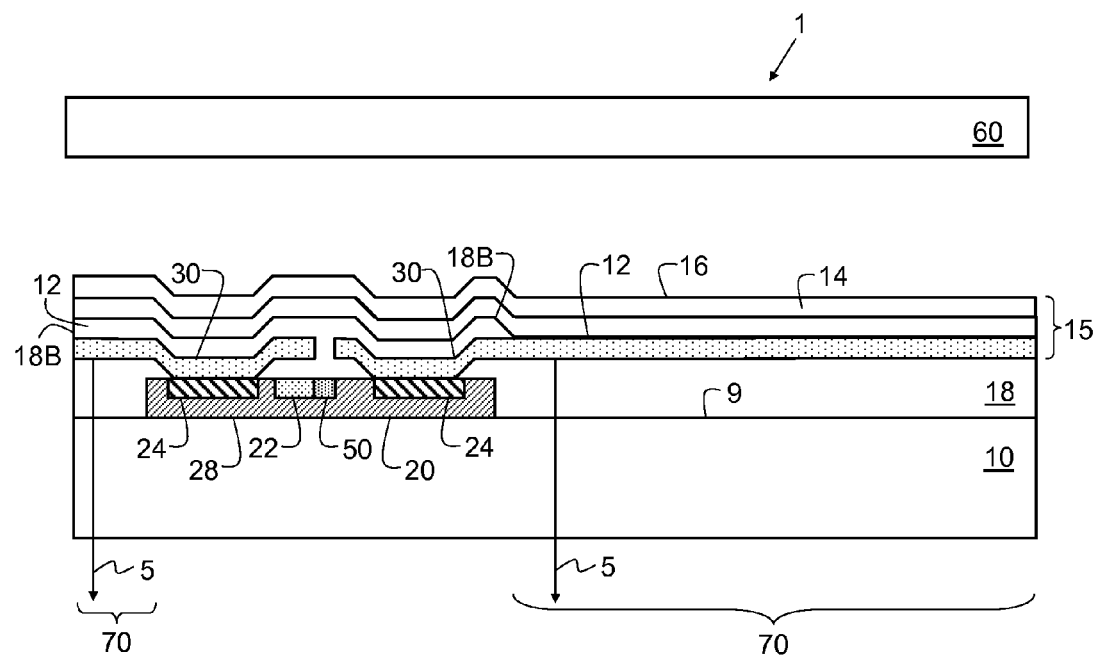
FIG. 1 is a partial cross section of one embodiment of the present invention.

Referring to FIG. 1, an electroluminescent (EL) lamp 1 includes a lamp substrate 10 having a device side 9. A first electrode 12 is formed over the lamp substrate 10 on device side 9, one or more layers 14 having light-emitting material are formed over the first electrode 12, and a second electrode 16 is formed over the one or more layers 14 of light-emitting material to form a light-emitting diode 15. The first and second electrodes 12, 16 provide current to cause one or more of the layers 14 of light-emitting material to emit light 5 in a light-emitting area 70.

A chiplet 20 having a chiplet substrate 28 separate and independent from the lamp substrate 10 is located and adhered to the lamp substrate 10 device side 9 with planarization and insulating layers 18 and 18B. The chiplet 20 includes one or more connection pads 24, a mechanical switch 50, and a control circuit 22 formed in the chiplet 20 for controlling the mechanical switch 50. The chiplet 20 is located over, and adhered to, device side 9 of the lamp substrate 10. The mechanical switch 50 is electrically connected to one or more connection pads 24 and at least one connection pad 24 is electrically connected to the first or second electrode 12, 16 with one or more electrical connection(s) 30. An insulating and planarization layer 18B is formed over at least a portion of the chiplet 20 and the electrical connections 30 so that the chiplet 20 is an embedded chiplet. In one embodiment of the present invention, the first or second electrode 12, 16 or light-emitting layer 14 is disposed over at least a portion of the embedded chiplet 20.

A cover 60 can encapsulate and protect the electroluminescent lamp 1. As used herein, the term "mechanical switch" is used interchangeably with the term "MEMS switch". Within the present disclosure, the term "mechanical switch" or "MEMS switch" 50 is a device which has a physically moving part for controlling the flow of current within a chiplet in response to a control circuit. The mechanical or MEMS switch is distinguished from, for example, transistors that control the flow of current or a voltage using electrical fields. The mechanical switch will typically include a conductive element that physically moves into, or out of, physical contact with another conductor to enable or disable a flow of current, for example in response to a magnetic field. It should be noted that the term "mechanical switch" or "MEMS switch" refers to a device having at least one such conductive element but it can refer to a device having multiple conductive elements that are connected in series or parallel. Connecting such devices in parallel can provide redundancy to safeguard against failure modes in which the switch is stuck open, preventing electrical contact. Parallel connection can also enable the mechanical or MEMS switch to support higher current. These devices can also be connected in series. Series connection can provide redundancy to safeguard against failure modes in which the switch is stuck closed, preventing the device from being turned off. It should also be noted that in some embodiments, the conductive element can be formed to prevent the flow of extremely high currents. For example, the sheet resistance within a region of the conductive element can be set high enough that the conductive element will serve as a fuse when excessively high currents, such as currents that might result from a short between the first and second electrodes, occur.

Figure 5:
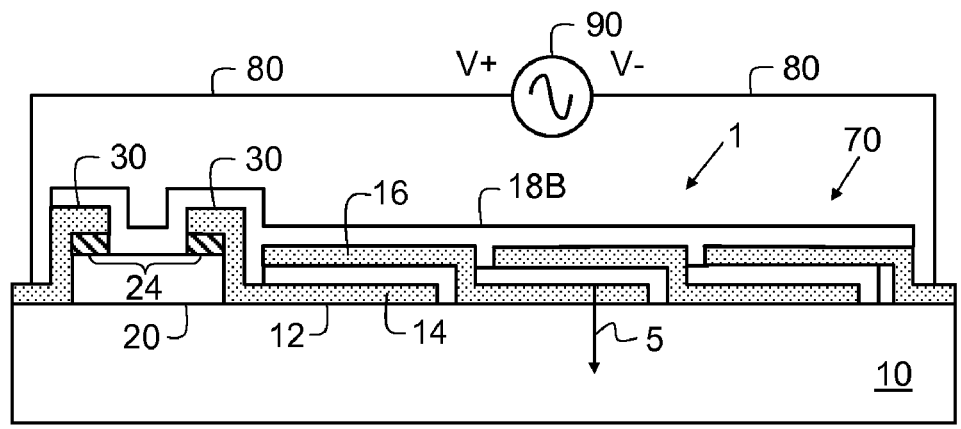
FIG. 5 is a schematic cross section of a chiplet and EL device with power source according to an embodiment of the present invention.
Figure 6:
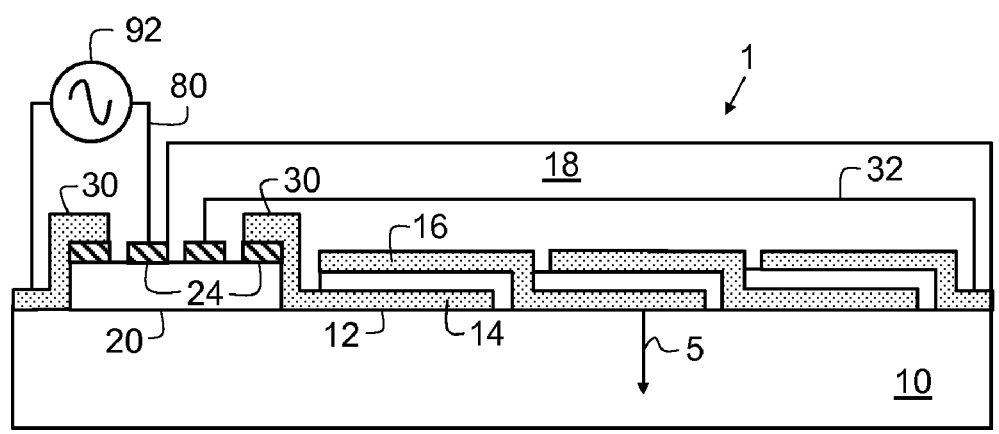
FIG. 6 is a schematic cross section of a chiplet and EL device with an alternatively-connected power source according to an embodiment of the present invention.

In one embodiment of the present invention, the mechanical switch 50 is a micro-electro-mechanical switch (MEMS), suitable for construction within an embedded chiplet 20, that serves as a relay. This mechanical switch 50 provides at least two different physical positions which can be selected among. In some arrangements, these two different physical positions will include one physical position wherein an electrical contact is formed between a connection pad 24, which is connected to either a voltage 90 or current 92 power source (as shown in FIGS. 5 and 6), and a separate connection pad 24 to control the flow of current from the electrical conductor to the first and second electrodes 12, 16. Typically, these at least two different physical positions will also include one physical position wherein the connection between the connection pad connected to an electrical conductor 80 and the connection pad 24 connected to the first or second electrode 12, 16 are not electrically connected. The location of the mechanical switch 50 is determined by MEMS control signals, which are provided by control circuit 22.

Figure 8:
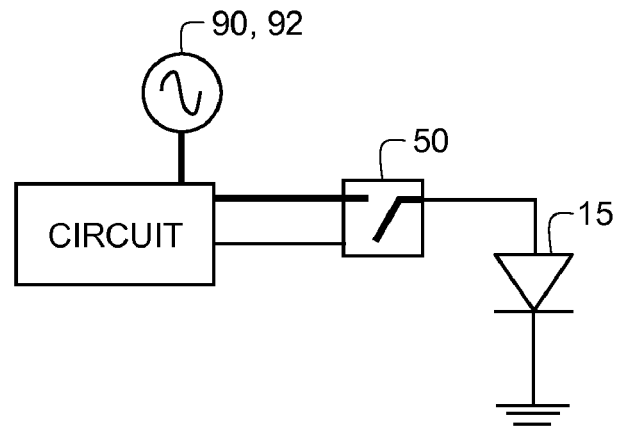
FIG. 8 is a light-emitting diode driving circuit according to an embodiment of the present invention.

In general, the control circuit 22 controls the luminance of the light emitted by the light-emitting diode 15 by controlling the location of the mechanical switch 50 to control the current to the first or second electrode 12, 16 or by controlling a voltage provided across the first and second electrodes 12, 16. For example, as shown in FIG. 8, the control circuit 22 can control the state of a mechanical switch (e.g. a MEMS) 50. The mechanical switch 50 has a connection to a power source, for example a voltage power source 90 providing a desired voltage or a current power source 92 providing a desired current, and a connection to the light-emitting diode 15. By controlling the mechanical switch 50 through the control circuit 22, power is supplied to the light-emitting diode 15 causing it to emit light. Since light-emitting diodes typically conduct current in only one direction, referring to FIG. 9 a rectifier 94 can convert alternating current from a power supply 90, 92 and supply it to the light-emitting diode 15 through mechanical switch 50 under the control of control circuit 22. The rectifier 94 can be considered part of the control circuit 22. In some embodiments, the mechanical switch 50 can have more than two different physical locations and more than one voltage or current source 90, 92 can be provided which supply a plurality of different levels of voltage or current and the mechanical switch can form electrical connections to select among the plurality of different voltage or current levels.

To fully appreciate the advantage of arrangements of the present invention, it is important to understand that prior-art control structures for EL display devices generally control the flow of current or voltage to the electrodes using transistors. These transistors are typically thin film transistors to provide low cost. Transistors formed of common materials, such as silicon in crystalline, polycrystalline or amorphous form are typically not capable of controlling power having a voltage differential much in excess of 20V and transistors formed of less common materials which can supply higher voltages are typically much more expensive. Further, current flows through a semiconductor within a TFT. All semiconductors have relatively low electron mobilities, by definition, and therefore transistors formed to carry a high current will have a large area and require the formation of chips with a large physical area, which is expensive. Hence, electronic power switches are not integrated into area-emissive lamps.

The use of the mechanical switch 50 of the present invention permits current or voltage to be controlled by enabling or disabling the flow of current through a highly conductive metal. Because electrons can readily flow through this highly conductive material, the mechanical switch 50 can be made to be very small and still enable the flow of high currents with much higher voltages to the electrodes 12, 16. The control circuit 22 can include transistors to provide the MEMS control signals. However, the MEMS control signals will typically be much lower in voltage and current than the voltage and current that the mechanical switch 50 will deliver from the power source 90, 92 to the first or second electrode 12, 16. Therefore, according to an embodiment of the present invention, these transistors can be small, enabling the construction of small, low-cost chiplets for controlling large currents suitable for integration into area-emissive electro-luminescent lamps.

In preferred embodiments, these chiplets will provide at least 1 mW of power to each first or second electrode 12, 16. In more preferred embodiments; these chiplets will provide at least 50 mW of power to each first or second electrode and in yet more preferred embodiments, these chiplets will provide at least 100 mW of power to each first or second electrode. It should also be noted that it is important that the chiplets are attached to the substrate and embedded in an insulating and planarization layer. Such a configuration permits the size of the connection pads to be minimized since, once these chiplets are affixed to the substrate, it is possible to use traditional, high resolution patterning processes, such as photolithography, to accurately place and open vias through the insulating and planarization layer to the contact pads and then to accurately pattern conducting layers such that they align with these vias, once again enabling the use of chiplets having a small area and therefore, having a low cost.

Figure 2:
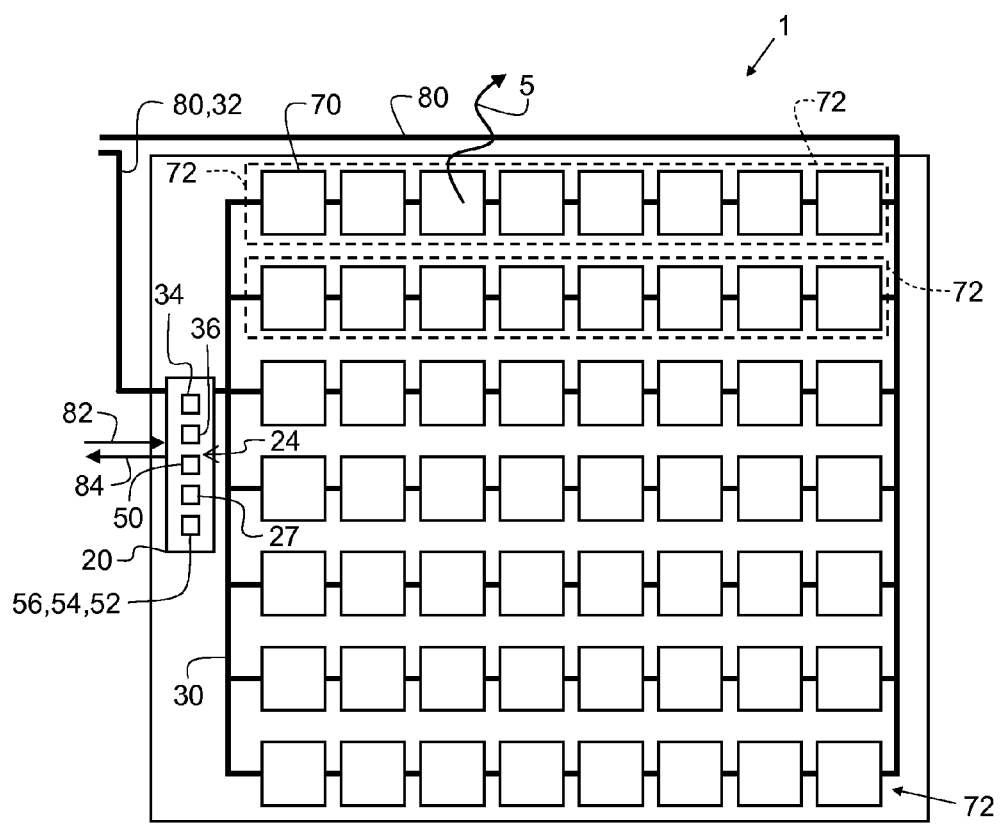
FIG. 2 is a schematic illustration of an embodiment of an EL device of the present invention.

Referring to FIG. 2, the electroluminescent lamp 1 of the present invention can further include electrical conductors 32, 80, for example electrical busses, externally accessible to the electroluminescent lamp 1 and electrically connected to connection pads 24 on the embedded chiplet 20 for receiving control signals, for example electrical control signals 82. Alternately, the chiplet 20 can include an optical sensor for receiving optical control signals 82. The embedded chiplet 20 can further include a signal-receiving circuit 27 (also in FIG. 4A) for receiving the control signals 82. The control signals 82 can be electrically communicated on the electrical conductor 32. The electrical conductors 80 can also provide power to the electroluminescent lamp 1. The control signals 82 can have a lower magnitude of voltage or current than the magnitude of the voltage or current used by the electrodes 12, 16 to provide current to cause the layer(s) 14 of light-emitting material (shown in FIG. 1) to emit light 5. In an embodiment, the control signals 82 can have a higher temporal frequency than the voltage or current signal used by the electrodes 12, 16 to provide current to cause the layer(s) 14 of light-emitting material (shown in FIG. 1) to emit light 5.

Figure 3:
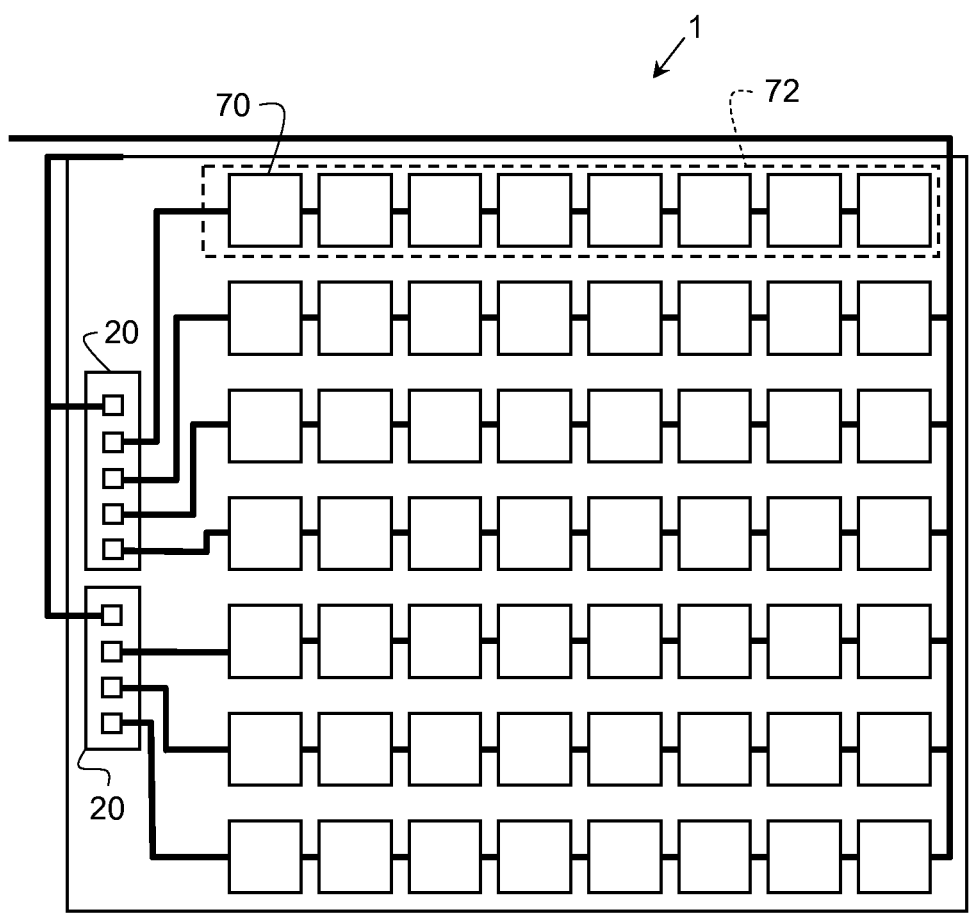
FIG. 3 is a schematic illustration of another embodiment of an EL device of the present invention.

Referring to FIGS. 1 and 3, the electroluminescent lamp 1 can include lamp substrate 10 having device side 9 on which is formed a plurality of independently-controllable first electrodes 12 formed over the lamp substrate 10 device side 9, one or more layers 14 having light-emitting material formed over the first electrodes 12, and one or more second electrodes 16 formed over the one or more layers 14, the first and second electrodes 12, 16 providing current to cause the light-emitting material layers 14 to emit light 5 in a plurality of independently-controllable separate light-emitting areas 70. For clarity, only a portion of the light-emitting areas 70 are shown.

The chiplet 20 having the chiplet substrate 28 separate and independent from the lamp substrate 10 and adhered to the lamp substrate 10 device side 9, includes a plurality of connection pads 24, mechanical switch 50, and control circuit 22 formed in the chiplet 20 for controlling the mechanical switch 50. The mechanical switch 50 is electrically connected to one or more connection pads 24 and at least one connection pad 24 is electrically connected to each of the plurality of first electrodes 12 with an independent electrical connection 30 to control the independently-controllable separate light-emitting areas 70. An insulating and planarization layer 18B is formed over at least a portion of the chiplet 20 and the electrical connections 30 so that the chiplet 20 is an embedded chiplet.

Referring also to FIG. 2, the light-emitting areas 70 formed by a plurality of electrically independent first or second electrodes 12, 16 can define groups 72 of commonly controlled light-emitting areas 70. Each group 72 can electrically connect a plurality of light-emitting areas 70 in series. Each light-emitting area 70 can be, for example an organic light-emitting diode (OLED). As shown in FIG. 2, the groups 72 are electrically connected in parallel. Alternatively, as shown in FIG. 3, each of the plurality of patterned first or second electrodes 12, 16 defining the individual light-emitting areas 70 electrically connect to the embedded chiplet 20 through a separate electrical connection 30 and connection pad 24 and are independently controlled by the embedded chiplet 20. The light-emitting areas 70, or groups 72 of light-emitting areas 70, can be located in a single row or single column on the substrate 10. Different light-emitting areas 70 or groups 72 can emit different colors of light and, under the control of control circuit 22, at different times to provide pleasing artistic or interesting lighting effects.

Referring to FIG. 5, in one embodiment of the present invention, the electroluminescent lamp 1 of FIG. 2 further includes a plurality of patterned first or second electrodes 12, 16, each of the first or second patterned electrodes 12, 16 providing current from the voltage power source 90 through electrical conductors 80 and electrical connections 30 to a separate light-emitting area 70 corresponding to the first or second electrode pattern. Each of the plurality of patterned first or second electrodes 12, 16 is electrically connected to the embedded chiplet 20 through a separate connection pad 24. Light 5 is emitted from the layer(s) 14 of light-emitting material formed between the electrodes 12, 16 when current is provided to the electrodes 12, 16 from the embedded chiplet 20 and power source 90. Referring also to FIG. 6, both first and second electrodes 12, 16 are connected to the embedded chiplet 20 through electrical conductor 32 connected to two separate connection pads 24. In both cases, planarization and insulating layer 18B can provide physical, chemical, and electrical protection to the organic materials, electrical connections, and chiplet. The power source of FIG. 6 can be a current-controlled power source 92.

Figure 4A:
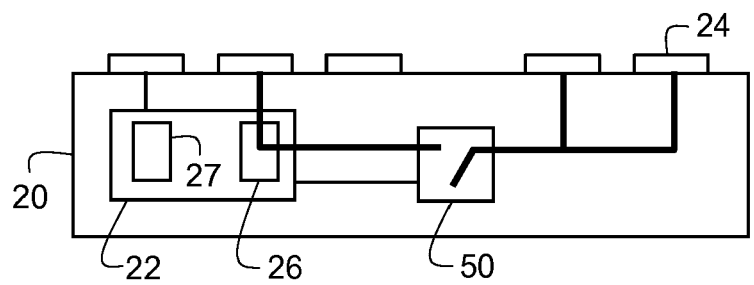
FIG. 4A is a cross section of a chiplet according to one embodiment of the present invention.
Figure 4B:
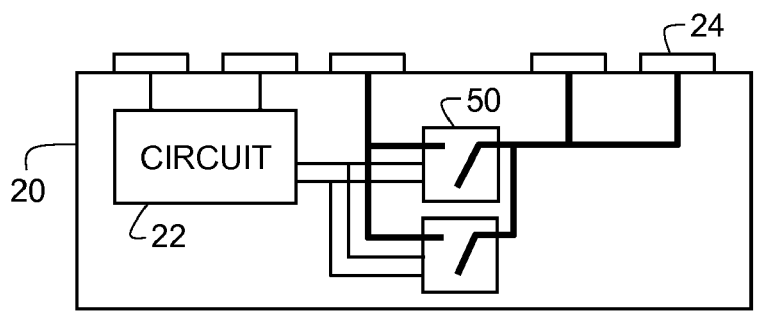
FIG. 4B is a cross section of a chiplet according to another embodiment of the present invention.
Figure 4C:
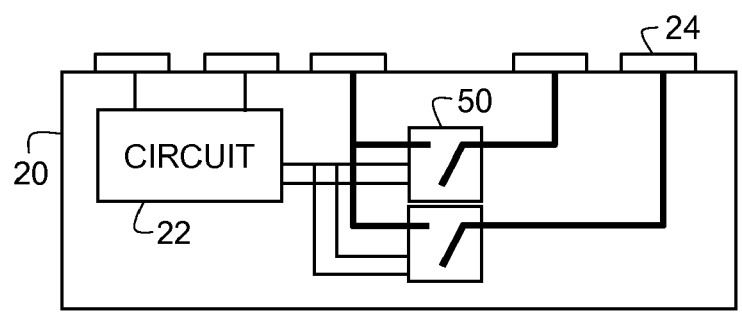
FIG. 4C is a cross section of a chiplet according to yet another embodiment of the present invention.

Referring to FIGS. 4A, 4B, and 4C, the electrically independent light-emitting areas or groups of light-emitting areas can be controlled through one or more micro-electro-mechanical switches 50 (MEMS) controlled by control circuits 26 in embedded chiplets 20. In the embodiment illustrated in FIG. 4A, a chiplet 20 having a single MEMS 50 can provide power to multiple commonly-connected connection pads 24 connected to multiple electrodes (shown in FIG. 2) controlled by control circuit 22. However, the current-carrying capacity of a single MEMS switch can be limited. Alternatively, if additional power is required, as shown in FIG. 4B a chiplet 20 having multiple MEMS 50 can be connected in parallel with control circuit 22 to provide greater current-carrying capacity. In yet another embodiment illustrated in FIG. 4C, separate MEMS 50 can be independently controlled by control circuit 22 to separate connection pads 24 to separately control independent first or second electrodes. In other embodiments, these arrangements can be combined, so that, for example, one connection pad is driven with two MEMS in parallel and another connection pad is driven with two other MEMS connected in parallel. Hence, an electroluminescent lamp having a single lamp substrate according to various embodiments of the present invention can have one light-emitting area controlled by one mechanical switch; one light-emitting area controlled by a plurality of mechanical switches connected in parallel; a plurality of independently-controlled light-emitting areas, each of the plurality of independently-controlled light-emitting areas controlled by a single mechanical switch; or a plurality of independently-controlled light-emitting areas, each of the plurality of independently-controlled light-emitting areas controlled by a plurality of mechanical switches connected in parallel. In any of the above embodiments, an independently controlled light-emitting area can be further divided into multiple light-emitting areas under common control (as shown in FIGS. 2 and 3). Multiple lamps can be provided in a lighting system, can be under common control, and can be interactive with users or the lamps can be mutually interactive.

As shown in FIG. 2, in a further embodiment of the present invention, the electroluminescent lamp 1 can include detection circuit 36 for detecting performance attributes of the lamp, for example light output, voltage, resistance, or current. These performance attributes can be communicated to an external monitoring system (not shown) with communication circuit 34 through signals 84. Signals associated with these performance attributes can be provided to the chiplet control circuit 22 which can then modify the control signals 82 to the MEMS switch 50. The electroluminescent lamp 1 can also include sensors for detecting environmental attributes, for example a motion detector 54 for detecting the presence of a human being, an accelerometer 56 for detecting the motion of the electroluminescent lamp, or an optical sensor 52 for sensing ambient illumination, reflected area illumination, or light output from the light-emitting areas 70. One or more sensors can detect the presence of a human being. A sound sensor can also be provided. The control circuit 22 can then control the flow of current to the first or second electrodes in response to signals from any one, or all, of the sensors. These sensors can also be controlled with a detection circuit 36 and communicated to a monitoring system (not shown) with a communication circuit 34 through signals 84. Alternately, signals from the detection circuit 36 can be provided to the chiplet control circuit 22 which will modify the control signals 82 to the MEMS switch 50 to control the flow of current to the first or second electrodes in response to signals from any one, or all, of the sensors. The optical sensor 52 can sense light to provide optical control signals that are then received by signal-receiving circuit 27. The optical control signals can be, for example, infra-red signals for turning the electroluminescent lamp 1 on or off, or providing dimming control by controlling the flow of current to the first or second electrodes (shown in FIG. 1). Hence, the optical control signals can have a frequency at least partly in the infrared frequency range. The communication circuit 34 can communicate a signal 84 (e.g. a status signal) responsive to the detected current, voltage, or sensor signals to an external monitoring system (not shown). Such an external monitoring system can, for example, report the status of an extensive lighting system including multiple electroluminescent lamps and schedule maintenance.

Figure 9:
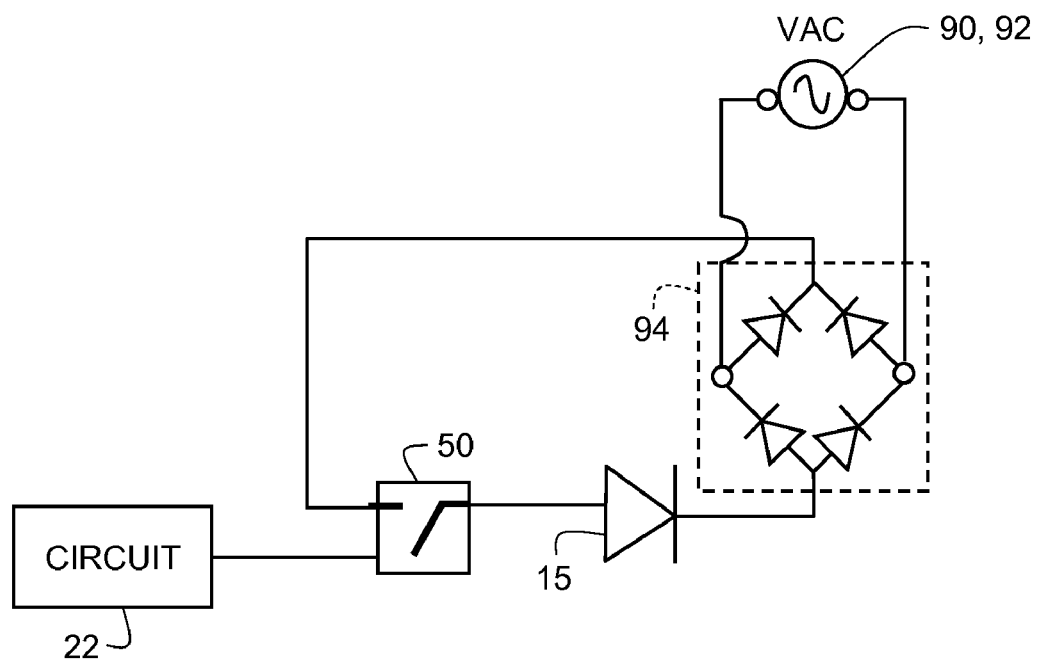
FIG. 9 is a light-emitting diode driving circuit having a rectifier according to an embodiment of the present invention.

The chiplet circuit 22 can include a variety of different circuits to provide control to the mechanical switch 50 and control the emission of light from the one or more layers 14 of light-emitting material. Referring to FIG. 4A in an embodiment of the present invention, the chiplet 20 including the chiplet circuit 22 includes a current-controlling circuit 26 for controlling current to the first or second electrode 12, 16. Alternatively, as shown in FIG. 6, a current-controlled power supply can be provided. The chiplet control circuit 22 can alternatively control the luminance of the light emitted by the light-emitting layer 14 by controlling a voltage provided across the first and second electrodes 12, 16 (FIG. 8). Alternatively, as shown in FIG. 5, a voltage-controlled power supply can be provided. If the power provided is alternating, a rectifier 94 can be included, as shown in FIG. 9. The rectifier 94 can be a part of the control circuit 22.

In yet another embodiment, the chiplet control circuit 22 controls the luminance of the light emitted by the light-emitting layer 14 by controlling the amount of time that the first and second electrodes 12, 16 provide current to the light-emitting layer 14. The luminance of the lamp is thus controlled through a form of pulse width modulation. The period of light output can be short enough to avoid perceptible flicker. In a further embodiment of the present invention, the different groups of light-emitting areas (as shown in FIG. 2) can emit light out of phase under control of the control circuit 22, so as to reduce perceptible flicker from the electroluminescent lamp 1. By out of phase is meant that one light-emitting element can emit light at a different time from another. Thus, it is possible for light to be emitted from the lamp at all times; if one light-emitting area is not illuminated, another can be. If the light-emitting areas are small, any flicker can be imperceptible. In other embodiments, different groups of light-emitting areas can have different off periods to control the average luminance of the electroluminescent lamp. In still other embodiments, the different groups of light-emitting areas can emit light with longer off periods to provide a desirable effect.

Figure 10:
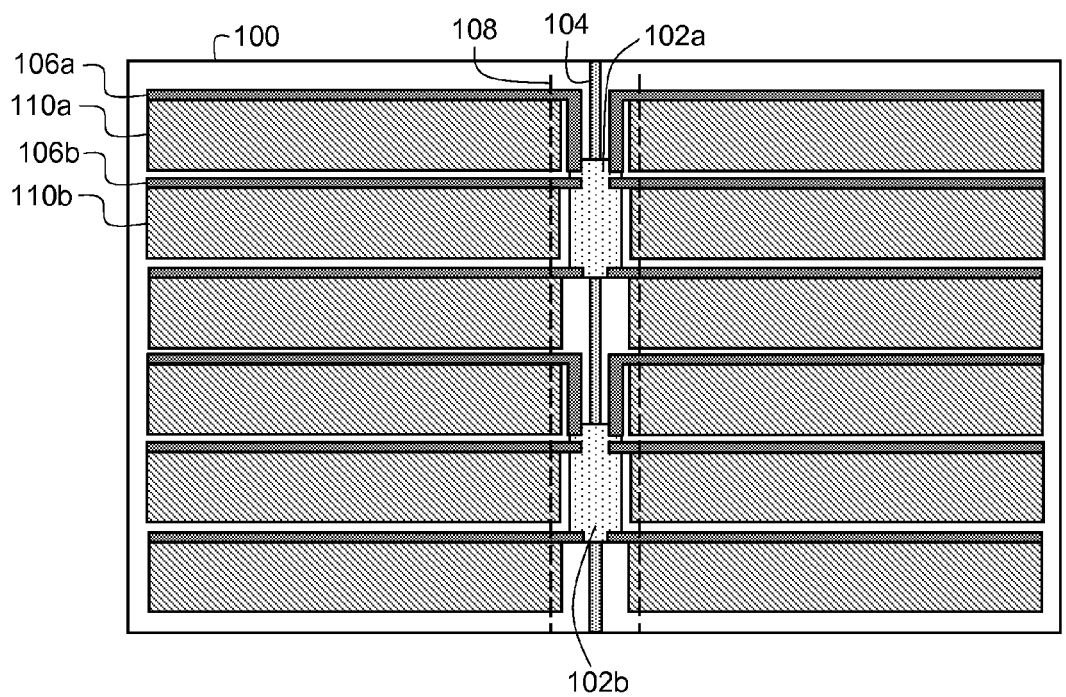
FIG. 10 is a plan view of a portion of a lamp according to an embodiment of the present invention.

Another useful embodiment is shown in FIG. 10. As shown in this plan view, the electroluminescent lamp 1 of the present invention can be formed such that multiple chiplets 102a, 102b, each containing a MEMS switch 50 are formed and placed on a substrate 100. An insulating planarization layer 18B (shown in FIG. 1) can then be formed over the chiplets 20 to encapsulate and embed them on the substrate 100 and can cover the entire substrate 100 or a portion of the substrate 100 on which light-emitting areas are to be formed. Vias can be formed through the insulating planarization layer 18B to provide access to the connection pads 24 (shown in FIG. 1). A metal layer can then be formed over the insulator and patterned to form electrical connectors 104 for connecting the chiplets to voltage or power sources or external communication systems to provide control signals to the embedded chiplet. During deposition and patterning of this metal layer to form electrical connectors 104, metal electrode wires 106a, 106b can be formed that connect to the connection pads 24 on the chiplet 20 and that serve to distribute the power over a relatively long distance. First electrodes 110a, 110b can be formed and patterned such that each of the first electrodes 110a, 110b is in contact with at least one of the metal electrode wires 106a, 106b. These electrodes will preferably be formed from a transparent or semi-transparent layer of material, such as a layer of ITO. A second insulating layer 108 is formed over the chiplets 20 and will typically extend over at least a portion of the metal electrode wires 106a, 106b. Light-emitting layers and a second electrode layer is formed over the device.

As shown in FIG. 10, the mechanical switches will control the flow of current separately to each of the metal electrode wires 106a, 106b and therefore to each first electrode 110a, 110b. Separate, independently-controllable, light-emitting areas are then formed over and defined by the area of each first electrode 110a, 110b. It is important in this embodiment that the light-emitting areas are long and narrow. In fact, these light-emitting areas will preferably have a high aspect ratio having a length along their long dimension that is at least 10 times their width in their narrow direction. This is preferable since the visibility of any area which ceases to function due, for example, to a short, will be significantly reduced over areas having smaller aspect ratios. In particularly-preferred embodiments, the width will in fact be less than 5 mm and preferably less than 3 mm. Further, each mechanical switch will be attached to a connection pad which provides power to a light-emitting area that is at least 3 cm$^2$ in area and more preferably to a light-emitting area that is at least 10 cm$^2$ in area. It should be noted that if the first electrodes 110a, 110b are formed from ITO or similar transparent or semi-transparent conductors without the presence of the metal electrode wires 106a, 106b along a significant portion of the length of the first electrodes 110a, 110b, the resistivity of the first electrodes would be such that a significant drop in current would occur along the length of these first electrodes 110a, 110b. Further, in a bottom-emitting lamp as shown in FIG. 1 wherein the light is emitted through the substrate 100, the first electrodes 110a, 110b will typically be formed from a transparent or semitransparent material to permit the light that is generated to be emitted from the device.

In a similar device, the first electrodes 110a, 110b can also be formed from metal, preferably the same metal as the metal electrodes 106a, 106b such that these first electrodes 110a, 110b are formed in the same step as the metal electrode wires 106a, 106b and the electrical connectors 104. In such a device, deposition of the transparent or semi-transparent layer can be avoided and the second electrode can be formed from this material. As such only a single metal layer and a single layer of transparent or semitransparent material are required to form the first and second electrodes, the metal electrode wires 106a, 106b, and the electrical connectors 104. However, in such a device, it can be desirable to form return lines (not shown) from the metal layer and connect the second electrode to the return lines through vias in the light-emitting layer.

In such a lamp, multiple chiplets 20, each having a chiplet substrate 28, are attached to a lamp substrate 10 wherein each chiplet 20 contains multiple, MEMs switches 50 for independently controlling the flow of current or voltage to a plurality of independently addressable light-emitting areas wherein the light-emitting areas a length along their long dimension that is at least 10 times their width in their narrow direction.

Figure 7:
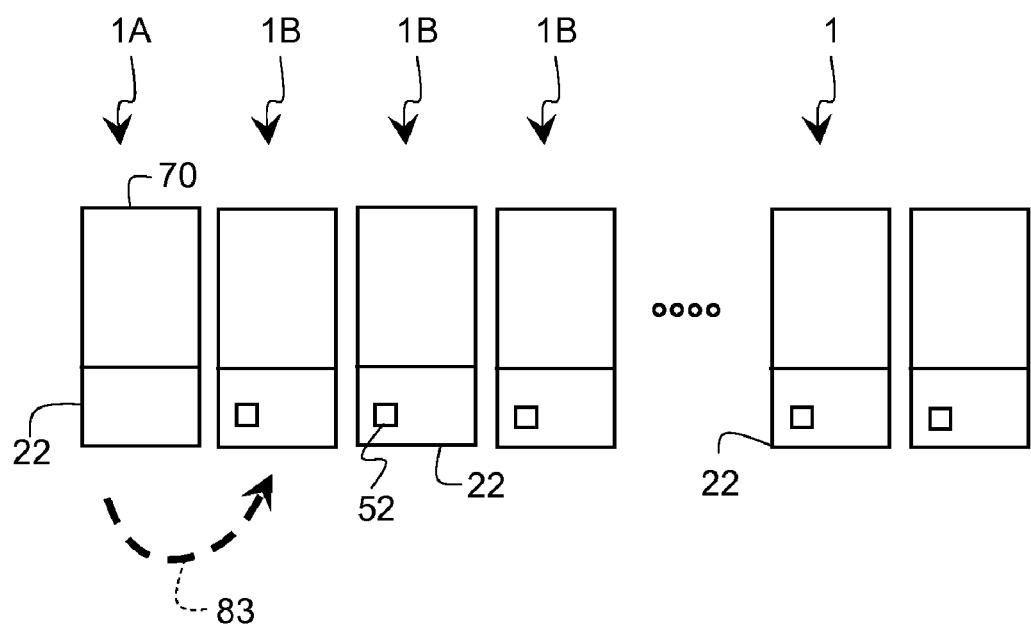
FIG. 7 is an illumination system according to an embodiment of the present invention.

Referring to FIG. 7, a plurality of the electroluminescent lamps 1 of the present invention can be employed to form an illumination system. At least one of the electroluminescent lamps 1A can be a control lamp 1A and the chiplet circuit 22 of the control lamp 1A can include a structure for sending control signals to another electroluminescent lamp 1B. Thus, at least one of the electroluminescent lamps 1 can be a receiving lamp 1B and the chiplet circuit 22 of the receiving lamp 1B can include a structure for receiving control signals from the control lamp 1A and controlling the luminance of the light-emitting layer in response to the control signals from the control lamp 1A. The control signals can be optical control signals 83 and the receiving lamps 1B can include optical sensors 52 responsive to the optical control signals 83. Alternatively, the control signals are electrical and the receiving lamps can include an electrical communication circuit responsive to the electrical control signals (as shown in FIG. 2). Finally, the control signals can be RF signals and the receiving lamps can include antennas and an RF communication circuit responsive to the RF control signals to receive the control signals.

In operation, an electroluminescent lamp, according to various embodiments of the present invention, can have power provided through an electrical connection from an external source. An external controller can be employed to send a control signal to one or more embedded chiplets to switch one or more mechanical switches on the lamp substrate of the electroluminescent lamp. The control signal can be electrical (i.e. wired) or optical (i.e. from an optical remote control). The control signal can send messages to a chiplet controller that controls the mechanical switch(es) to provide power to one or more light-emitting areas formed on the electroluminescent lamp substrate, thereby emitting light. Sensors formed in the chiplets or on the lamp substrate can respond to optical control signals.

The electroluminescent lamps of the present invention can also include sensors. When sensors are activated, the electroluminescent lamp can change its state of light emission, for example turning on or off, or increasing or decreasing luminance. Such sensors can detect, for example, motion of another body, or motion of the lamp itself. Hence, electroluminescent lamps of the present invention can turn on or off in response to the presence of moving humans or by waving (accelerating or decelerating) the lamp in a chosen direction. Electroluminescent lamps of the present invention can also communicate and respond to signals from other lamps. For example, one lamp according to the present invention can control other lamps by optically or electrically sending signals to the other lamps. Hence, not all of the lamps need to have a human-operated external control mechanism. An operator, for example, can control a control lamp and the control lamp then control other lamps through an electrical connection or by modulating the light emission from the control lamp. This modulated light can be detected by other lamps that then respond to the control lamp with the appropriate function.

The present invention provides numerous advantages over lamps of the prior art. By integrating mechanical switches onto the substrate of the lamp using embedded chiplets, high current switching is provided with little loss. The embedded chiplets can have digital circuitry and sensors built in to provide intelligent lighting mechanisms and responsiveness to the external environment. These capabilities, in turn, can provide improved efficiency and usability, and reduce the infrastructure (i.e. wiring) that would otherwise be necessary to control lighting systems employing electroluminescent lamps of the present invention.

By providing a plurality of independently-controllable first electrodes, multiple, independently-controllable light-emitting areas can be formed and provide more robust operation by controlling relatively small regions of the luminaire separately from other small regions. In the presence of shorting, this independent control of numerous small regions enables most of the light to function properly although one small region can cease to function.

Furthermore, because chiplets can be manufactured in large quantities from silicon wafers widely used in the semiconductor industry, they can be relatively inexpensive. It is also possible for the chiplets embedded within electroluminescent lamps of the present invention to be self-testing by monitoring light output or current use. The results of the monitoring can be reported to central locations for maintenance or for adaptive local control. For example, if one light-emitting area on an electroluminescent lamp of the present invention fails, the failure can be detected by monitoring the current used or light output by the light-emitting area. Other light-emitting areas can then be controlled to emit more light (with a consequent reduction in lifetime) to maintain the short-term performance of the lamp. The change in lamp performance can then be reported to a central location and the lamp scheduled for replacement. In the meantime, the lamp can emit light as designed.

The electroluminescent materials employed in electroluminescent lamps of the present invention are known in the art. Furthermore, the formation of wires over a substrate is also known, for example in the photolithographic industry. Micromechanical switches are discussed in the literature, for example "A High-Current Electrothermal Bistable MEMS Relay" by Qiu et al in Micro Electro Mechanical Systems, published January 2003, pages 64-67.

According to various embodiments of the present invention, the chiplets can be constructed in a variety of ways, for example with one or two rows of connection pads along a long dimension of a chiplet. Interconnection busses and wires can be formed from various materials and can be deposited on the device substrate using various methods. For example, interconnection busses and wires can be metal, either evaporated or sputtered, for example aluminum or aluminum alloys. Alternatively, the interconnection busses and wires can be made of cured conductive inks or metal oxides. In one cost-advantaged embodiment, the interconnection busses and wires are formed in a single layer.

A chiplet is a relatively small integrated circuit compared to the lamp substrate and can include a circuit including wires, connection pads, passive components such as resistors or capacitors, or active components such as transistors or diodes, formed on an independent substrate, as well as one or more mechanical switches. Chiplets are separately manufactured from the lamp substrate and then applied to the lamp substrate. The chiplets are preferably manufactured using silicon or silicon on insulator (SOI) wafers using known processes for fabricating semiconductor devices. Each chiplet is then separated prior to attachment to the lamp substrate. The crystalline base of each embedded chiplet can therefore be considered a substrate separate from the lamp substrate and over which the chiplet circuitry is disposed. A plurality of chiplets therefore has a corresponding plurality of substrates separate from the lamp substrate and each other. In particular, the independent chiplet substrates are separate from the lamp substrate on which the electroluminescent light-emitting area (s) are formed and the areas of the independent, chiplet substrates, taken together, are smaller than the area of the lamp substrate. Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of adhesive and planarization material over the chiplet that can then be applied using conventional spin-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and electrodes to drive light-emitting areas.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connection to the wiring layer provided over the chiplets once assembled onto the display substrate. The connection pads are sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. The pads will thus generally be significantly larger than the transistor circuitry formed in the chiplet.

The connection pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon), a device with high performance is provided. Since crystalline silicon has not only high performance but also much smaller active elements (e.g. transistors) than other circuitry formation methods using, for example, poly-crystalline or amorphous silicon, the circuitry size is much reduced. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

The present invention can be employed in a wide variety of conventional applications, for example in a table-top lamp, floor lamp, or chandelier. Alternatively, the invention can be employed as a flat-panel illumination device for a conventional suspended ceiling. The present invention can also be employed in portable illumination devices using DC power sources.

The present invention can be employed in devices having a multi-lamp infrastructure. In particular, the present invention can be practiced with LED devices, either organic or inorganic. In a preferred embodiment, the present invention is employed in a flat-panel OLED device composed of small-molecule or polymeric OLEDs as disclosed in, but not limited to U.S. Pat. No. 4,769,292 to Tang et al., and U.S. Pat. No. 5,061,569 to Van Slyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either top- or bottom-emitter architectures.

The invention has been described in detail with particular reference to certain preferred embodiments thereof, but it will be understood that variations and modifications can be effected within the scope of the invention.

PARTS LIST 1 electroluminescent lamp
1A control electroluminescent lamp
1B receiving electroluminescent lamp
5 light
9 device side
10 lamp substrate
12 first electrode
14 layers of light-emitting material
15 light-emitting diode
16 second electrode
18, 18B planarization and insulating layer
20 chiplet
22 chiplet control circuit
24 connection pad
26 current-controlling circuit
27 signal-receiving circuit
28 chiplet substrate
30 electrical connection, conductor
32 electrical conductor
34 communication circuit
36 detection circuit
50 MEMS switch
52 optical sensor
54 motion sensor
56 accelerometer
60 cover
70 light-emitting areas
72 series-connected groups of light-emitting areas
80 electrical conductor
82 control signals
83 optical control signals
84 signals
90 voltage power source
92 current power source
94 rectifier
100 substrate
102a chiplet
102b chiplet
104 electrical connector
106a electrode wire
106b electrode wire
108 insulating layer
110a first electrode
110b first electrode

The invention claimed is:

1. An electroluminescent lamp, comprising:
(a) a lamp substrate having a device side;
(b) a first electrode formed over the lamp substrate device side, one or more layers having light-emitting material formed over the first electrode, and a second electrode formed over the one or more layers, the first and second electrodes providing current to cause the light-emitting material to emit light in a light-emitting area;
(c) a chiplet having a chiplet substrate separate and independent from the lamp substrate and adhered to the lamp substrate device side, one or more connection pads, a mechanical switch, and a control circuit for controlling the mechanical switch, the mechanical switch electrically connected to one or more connection pads and at least one connection pad electrically connected to the first or second electrode with one or more electrical connection(s); and
(d) an insulating and planarization layer formed over at least a portion of the chiplet and the electrical connections so that the chiplet is an embedded chiplet.

2. The electroluminescent lamp of claim 1 wherein the first or second electrode or light-emitting layer is disposed over at least a portion of the embedded chiplet.

3. The electroluminescent lamp of claim 2 wherein the control circuit includes a rectifier.

4. The electroluminescent lamp of claim 2 further including one or more electrical conductors externally accessible to the electroluminescent lamp and electrically connected to a connection pad on the embedded chiplet for receiving control or power signals and wherein the embedded chiplet further includes a signal-receiving circuit for receiving control signals.

5. The electroluminescent lamp of claim 4 wherein the control signals have a lower magnitude of voltage or current than the magnitude of the voltage or current used by the electrodes to provide current to cause the light-emitting material to emit light.

6. The electroluminescent lamp of claim 2 wherein the embedded chiplet further includes an optical sensor for sensing light to provide optical control signals and wherein the control circuit further includes a signal-receiving circuit for receiving the optical control signals.

7. The electroluminescent lamp of claim 6 wherein the optical sensor receives light having a frequency at least partly in the infrared frequency range.

8. The electroluminescent lamp of claim 1 wherein the control circuit controls the luminance of the light emitted by the light-emitting layer by controlling current to the first or second electrode or by controlling a voltage provided across the first and second electrodes.

9. The electroluminescent lamp of claim 1 wherein the circuit controls the luminance of the light emitted by the light-emitting layer by controlling the amount of time that the first and second electrodes provide power to the light-emitting layer.

10. The electroluminescent lamp of claim 1 further comprising an optical sensor in the embedded chiplet for sensing ambient light wherein the control circuit controls the luminance of the lamp in response to the sensed ambient light.

11. The electroluminescent lamp of claim 1 wherein the mechanical switch is a micro-electromechanical switch.

12. The electroluminescent lamp of claim 1 wherein the embedded chiplet further includes a motion sensor or accelerometer for controlling the luminance of the lamp.

13. The electroluminescent lamp of claim 1 further comprising a plurality of embedded chiplets, each embedded chiplet including a mechanical switch.

14. The electroluminescent lamp of claim 1 wherein the embedded chiplet further includes a detection circuit for detecting current passing through the light-emitting layer or light emitted by the light-emitting layer and a communication circuit for providing a status signal responsive to the detected current or detected light output.

15. The electroluminescent lamp of claim 1 wherein the first and second electrodes are connected to the embedded chiplet through two separate connection pads.

16. An illumination system, comprising:
(a) a plurality of the electroluminescent lamps of claim 1;

(b) wherein at least one of the electroluminescent lamps is a control lamp and the embedded chiplet of the control lamp further includes means for sending control signals to a receiving electroluminescent lamp; and (c) wherein the embedded chiplet of the receiving lamp includes means for receiving control signals from the control lamp and controlling the luminance of the receiving lamp in response to the control signals.

17. The electroluminescent lamp of claim 16 wherein the control signals are optical or electrical.

18. An electroluminescent lamp, comprising:

(a) a lamp substrate having a device side;

(b) a plurality of independently-controllable first electrodes formed over the lamp substrate device side, one or more layers having light-emitting material formed over the first electrodes, and one or more second electrodes formed over the one or more layers, the first and second electrodes providing current to cause the light-emitting material to emit light in a plurality of independently-controllable separate light-emitting areas;

(c) a chiplet having a chiplet substrate separate and independent from the lamp substrate and adhered to the lamp substrate device side, a plurality of connection pads, a mechanical switch, and a control circuit formed in the chiplet for controlling the mechanical switch, the mechanical switch electrically connected to one or more connection pads and at least one connection pad electrically connected to each of the plurality of first electrodes with an independent electrical connection to control the independently-controllable separate light-emitting areas; and (d) an insulating and planarization layer formed over at least a portion of the chiplet and the electrical connections so that the chiplet is an embedded chiplet.

19. The electroluminescent lamp of claim 18 wherein the independent light-emitting areas emit at different times under the control of the control circuit.

20. The electroluminescent lamp of claim 18 wherein the embedded chiplet independently controls each of the plurality of first or second electrodes and the corresponding light-emitting area.

21. The electroluminescent lamp of claim 18 wherein the plurality of light-emitting areas emit different colors of light.

* * * * *